(12) United States Patent
Imai

(10) Patent No.: US 9,666,455 B2
(45) Date of Patent: May 30, 2017

(54) SUBSTRATE CLEANING APPARATUS

(71) Applicant: Ebara Corporation, Tokyo (JP)

(72) Inventor: Masayoshi Imai, Tokyo (JP)

(73) Assignee: Ebara Corporation, Tokyo (JP)

( * ) Notice: Subject to any disclaimer, the term of this patent is extended or adjusted under 35 U.S.C. 154(b) by 59 days.

(21) Appl. No.: 13/896,084

(22) Filed: May 16, 2013

(65) Prior Publication Data
US 2013/0306116 A1 Nov. 21, 2013

(30) Foreign Application Priority Data

May 17, 2012 (JP) .................................. 2012-113280
Apr. 25, 2013 (JP) .................................. 2013-92632

(51) Int. Cl.
*H01L 21/67* (2006.01)
*H01L 21/677* (2006.01)

(52) U.S. Cl.
CPC .. *H01L 21/67034* (2013.01); *H01L 21/67028* (2013.01); *H01L 21/6776* (2013.01); *H01L 21/67173* (2013.01)

(58) Field of Classification Search
CPC .............. H01L 21/67; H01L 21/67028; H01L 21/67173; H01L 21/6776
See application file for complete search history.

(56) References Cited

U.S. PATENT DOCUMENTS

| 5,901,399 | A  | * | 5/1999  | Moinpour et al. ................. 15/77 |
| 6,213,853 | B1 |   | 4/2001  | Gonzalez-Martin et al. |
| 8,226,771 | B2 |   | 7/2012  | Oikawa et al. |
| 2005/0000110 | A1 | * | 1/2005 | Park et al. .................. 34/236 |
| 2007/0107253 | A1 | * | 5/2007 | Nishiura ....................... 34/444 |
| 2009/0301518 | A1 | * | 12/2009 | Oikawa et al. ............... 134/1.3 |
| 2010/0325913 | A1 | * | 12/2010 | Wang et al. .................. 34/423 |

FOREIGN PATENT DOCUMENTS

| JP | 10-004074 A | 1/1998 |
| JP | 10-209110 A | 8/1998 |
| JP | 10-270392 | 10/1998 |
| JP | 11-340184 | 12/1999 |
| JP | 2002-043266 A | 2/2002 |
| JP | 2002-217151 | 8/2002 |
| JP | 2002-540598 A | 11/2002 |

(Continued)

*Primary Examiner* — Michael Barr
*Assistant Examiner* — Rita Adhlakha
(74) *Attorney, Agent, or Firm* — Baker & Hostetler LLP

(57) ABSTRACT

A substrate cleaning apparatus cleans a surface of a substrate such as a semiconductor wafer and dries the substrate. The substrate cleaning apparatus includes a process chamber having a substrate conveying unit configured to hold a substrate horizontally with its upper surface facing upwardly and to convey the substrate in one direction, and a cleaning unit configured to clean the surface of the substrate in non-contact state by supplying a cleaning liquid to the surface of the substrate which is moving in the process chamber. The substrate apparatus has an inert gas blowing unit configured to blow an inert gas toward the front and reverse surfaces of the substrate which has been cleaned in the cleaning unit to produce an inert gas atmosphere in the process chamber while drying the substrate with the inert gas.

8 Claims, 6 Drawing Sheets

(56) References Cited

FOREIGN PATENT DOCUMENTS

| | | |
|---|---|---|
| JP | 2003-145064 A | 5/2003 |
| JP | 2004-022940 | 1/2004 |
| JP | 2006-073573 | 3/2006 |
| JP | 2006-247618 | 9/2006 |
| JP | 2007-134665 A | 5/2007 |
| JP | 2007-295011 A | 11/2007 |
| JP | 2010-118644 | 5/2010 |
| TW | 201005854 A | 2/2010 |
| WO | WO 98/08418 A1 | 3/1998 |
| WO | WO 00/57455 A1 | 9/2000 |
| WO | WO 2007/108315 | 9/2007 |

\* cited by examiner

SUBSTRATE CLEANING APPARATUS

CROSS REFERENCE TO RELATED APPLICATIONS

This document claims priorities to Japanese Patent Application Number 2012-113280, filed May 17, 2012 and Japanese Patent Application Number 2013-92632, filed Apr. 25, 2013, the entire contents of which are hereby incorporated by reference.

BACKGROUND OF THE INVENTION

Field of the Invention

The present invention relates to a substrate cleaning apparatus for cleaning a surface of a substrate such as a semiconductor wafer and drying the substrate, and more particularly to a substrate cleaning apparatus which can deal with a large semiconductor wafer having a diameter of 450 mm, and can clean a surface of a substrate efficiently after a polishing process such as CMP and dry the substrate.

Description of the Related Art

For example, in a damascene interconnect forming process for forming interconnects by filling a metal into interconnect trenches formed in an insulating film on a surface of a substrate, an extra metal on the surface of the substrate is polished away by chemical mechanical polishing (CMP) after the formation of damascene interconnects. A residue of a slurry (slurry residue) that has been used in polishing, metal polishing debris and the like exists on the surface of the substrate after polishing. Therefore, it is necessary to remove the residues (particles) remaining on the surface of the substrate after polishing.

As a substrate cleaning method for cleaning a surface of a substrate after polishing, there has been known a roll scrub cleaning method for cleaning a surface of a substrate, such as a semiconductor wafer, with a long cylindrical roll cleaning member (roll sponge or roll blush) extending horizontally by rotating the substrate and the roll cleaning member while keeping the roll cleaning member in contact with the surface of the substrate in the presence of a cleaning liquid. The substrate which has been cleaned is generally rinsed by pure water (DIW) or the like, and is then spin-dried by rotating the substrate at a high speed, as disclosed in Japanese laid-open patent publication No. 11-340184.

In a substrate cleaning apparatus for cleaning a substrate such as a semiconductor wafer in the presence of a cleaning liquid while the substrate is rotated, it is difficult to process (clean) an entire surface of the substrate uniformly because of different flow velocities of the cleaning liquid, different thicknesses of liquid films and different temperatures of the cleaning liquid at respective portions such as a central portion, an edge portion, and the like of the substrate surface. Further, in the case where the substrate surface having an exposed low-dielectric constant film (low-k film) serving as an insulating film is cleaned, because the low-k film is hydrophobic, non-uniformity of water wetting properties of the substrate surface is increased and uniform cleaning over the entire surface of the substrate becomes further difficult. Particularly, when a surface of a large substrate such as a semiconductor wafer having a diameter of 450 mm is cleaned, this tendency becomes prominent.

Recently, copper has been used as interconnect metal. When copper is brought into contact with a liquid such as pure water containing no anticorrosive, the copper becomes eroded easily by oxygen contained in the liquid such as pure water, resulting in reliability degradation in copper interconnects and a decrease in product yield due to short-circuit or open-circuit of the copper interconnects. Therefore, it is desirable that when the substrate surface having the exposed copper is cleaned, corrosion of copper caused by oxygen contained in the liquid such as pure water should be prevented as much as possible. Even if pure water or the like having a small amount of dissolved oxygen is used, corrosion of the copper surface caused by dissolution of oxygen in the air into pure water or the like may occur when the substrate surface is cleaned (rinsed) by supplying pure water or the like.

In order not to take oxygen in the air into pure water or the like which has no anticorrosive and is used for cleaning the substrate surface, it is considered that the substrate surface is cleaned in an inert gas atmosphere. However, in the substrate cleaning apparatus for cleaning the substrate such as a semiconductor wafer in the presence of the cleaning liquid while the substrate is rotated, it is necessary to install a mechanism for holding the substrate and rotating the substrate. Therefore, in the case where a cleaning unit having such mechanism is housed in a process chamber, the volume of the process chamber becomes considerably large. Thus, it is difficult to create a desired inert gas atmosphere in the process chamber.

As a substrate cleaning apparatus for cleaning a surface of a substrate without rotating the substrate, there have been proposed a substrate cleaning apparatus in which after polishing, a substrate is cleaned while the substrate is conveyed in one direction by a roller conveyer or the like as disclosed in Japanese laid-open patent publication Nos. 10-270392, 2002-217151 and 2006-73573, a substrate cleaning apparatus in which after polishing, a substrate is cleaned while the substrate is conveyed in non-contact state by a propulsive force of fluid jet as disclosed in Japanese laid-open patent publication No. 2005-322936, and a substrate cleaning apparatus in which after polishing, a substrate is cleaned while the substrate is conveyed by a transport belt as disclosed in Publication No. 2001-501030 for Published Japanese translation of PCT International Publication No. WO98/08418.

Further, there have been proposed a substrate cleaning apparatus for cleaning a surface of a substrate by ejecting mist-like fluid (fluid mixture of gas and liquid) from a two-fluid nozzle to the surface of the substrate during conveyance of the substrate as disclosed in Japanese laid-open patent publication Nos. 2006-247618 and 2010-118644, and a substrate cleaning apparatus for cleaning a surface of a substrate in a store room filled with an inert gas such as nitrogen gas in order to prevent oxidation or reforming of the processed surface of the substrate as disclosed in Japanese laid-open patent publication No. 2004-22940.

The applicant of the present invention has proposed a substrate processing apparatus having at least one of an ultrasonic cleaning apparatus for cleaning a surface of a substrate by ultrasonic waves propagated through a liquid and a two-fluid jet cleaning apparatus for cleaning the surface of the substrate by two-fluid jet comprising a fluid mixture of gas and liquid as disclosed in International Patent Publication No. WO 2007/108315.

SUMMARY OF THE INVENTION

However, the conventional substrate cleaning apparatus cannot satisfy both of the requirements for cleaning an entire surface of the substrate uniformly even if the substrate has a hydrophobic surface and has a large diameter and for preventing corrosion of copper, used for interconnect metal, caused by contact of copper with pure water or the like as much as possible.

The present invention has been made in view of the above. It is therefore an object of the present invention to provide a substrate cleaning apparatus which can clean an entire surface of the substrate uniformly even if the substrate has a hydrophobic surface and has a large diameter, and can prevent corrosion of copper, used for interconnect metal, caused by contact of copper with pure water or the like as much as possible by a relatively simple structure.

In order to achieve the above object, according to one aspect of the present invention, there is provided a substrate cleaning apparatus comprising: a process chamber having a substrate conveying unit therein configured to hold a substrate horizontally with its upper surface facing upwardly and to convey the substrate in one direction; a cleaning unit configured to clean the surface of the substrate in non-contact state by supplying a cleaning liquid to the surface of the substrate which is moving in the process chamber, and an inert gas blowing unit configured to blow an inert gas toward the front and reverse surfaces of the substrate which has been cleaned in the cleaning unit to produce an inert gas atmosphere in the process chamber while drying the substrate with the inert gas.

According to the present invention, in the process chamber, while the substrate is conveyed in a sliding manner in one direction, the cleaning liquid is supplied to the surface of the substrate to clean the surface of the substrate in non-contact state. Thus, the cleaning liquid is supplied uniformly over the entire surface including the edge portion of the substrate, and the entire surface of the substrate can be cleaned uniformly and efficiently even if the substrate has a hydrophobic surface and has a large diameter. Further, it is not necessary to rotate the substrate during cleaning, and thus the volume of the process chamber can be diminished. Thus, the inert gas used to dry the substrate can be effectively utilized to produce a desired inert gas atmosphere in the process chamber where corrosion of copper, used for interconnect metal, caused by contact of copper with pure water or the like can be prevented as much as possible.

In a preferred aspect of the present invention, a flow of the inert gas toward an inlet side of the process chamber is formed by blowing the inert gas toward the front and reverse surfaces of the substrate from the inert gas blowing unit.

According to the present invention, while air is prevented from flowing into the process chamber through the inlet of the process chamber, the inert gas atmosphere can be produced in the process chamber.

In a preferred aspect of the present invention, the inert gas comprises $N_2$ gas or Ar gas, and the inert gas atmosphere in the process chamber comprises an atmosphere having an oxygen concentration of 2% or less.

According to the present invention, by using $N_2$ gas or Ar gas as the inert gas to produce an inert gas atmosphere in the process chamber having an oxygen concentration of 2% or less, preferably 1% or less, oxygen contained in the air in the process chamber can be prevented from being taken into pure water or the like ejected toward the substrate.

In a preferred aspect of the present invention, the cleaning unit comprises at least one of a two-fluid jet cleaning unit configured to clean the surface of the substrate with two-fluid jet stream comprising a fluid mixture of gas and liquid and an ultrasonic cleaning unit configured to clean the surface of the substrate with ultrasonic waves propagated in liquid.

According to the present invention, by cleaning the surface of the substrate by the two-fluid jet cleaning unit and/or the ultrasonic cleaning unit, minute particles remaining on the surface of the substrate which are difficult to remove by scrub cleaning can be removed.

In a preferred aspect of the present invention, the substrate conveying unit comprises a roller conveyer having a plurality of rollers spaced from each other, and a cleaning liquid supply nozzle configured to supply a cleaning liquid to the reverse surface of the substrate is disposed at the upstream side of the inert gas blowing unit.

According to the present invention, in the process chamber, while the substrate is conveyed in a sliding manner in one direction, a cleaning liquid such as pure water or the like is supplied to the reverse surface of the substrate to clean (rinse) the reverse surface.

In a preferred aspect of the present invention, the inert gas blowing unit comprises at least one air knife configured to blow the inert gas in the form of a sheet to the substrate.

According to the present invention, the inert gas in the form of a sharp knife is blown toward the front and reverse surfaces of the substrate, and thus the substrate can be dried more quickly and the flow of the inert gas formed in the process chamber and flowing toward the inlet side of the process chamber can be accelerated in its flow velocity.

In a preferred aspect of the present invention, the substrate cleaning apparatus further comprises a bevel cleaning chamber coupled to the inlet of the process chamber and having a bevel cleaning unit configured to clean the bevel portion of the substrate therein.

According to the present invention, cleaning of the bevel portion of the substrate after polishing, cleaning of the surface of the substrate and drying of the substrate can be successively performed.

In a preferred aspect of the present invention, the bevel cleaning unit is configured to clean the bevel portion of the substrate while holding the substrate horizontally and rotating the substrate, and to transfer the substrate to the substrate conveying unit while holding the substrate horizontally.

According to the present invention, while the substrate is held horizontally, cleaning of the bevel portion of the substrate after polishing, cleaning of the surface of the substrate and drying of the substrate can be successively performed.

According to the substrate cleaning apparatus of the present invention, even if a substrate has a hydrophobic surface and has a large diameter, the entire surface of the substrate can be cleaned uniformly and efficiently. Further, by a relatively simple structure which utilizes an inert gas effectively to dry the substrate, corrosion of copper, used for interconnect metal, caused by contact of copper with pure water or the like can be prevented as much as possible.

DETAILED DESCRIPTION OF THE PREFERRED EMBODIMENTS

Figure 1:
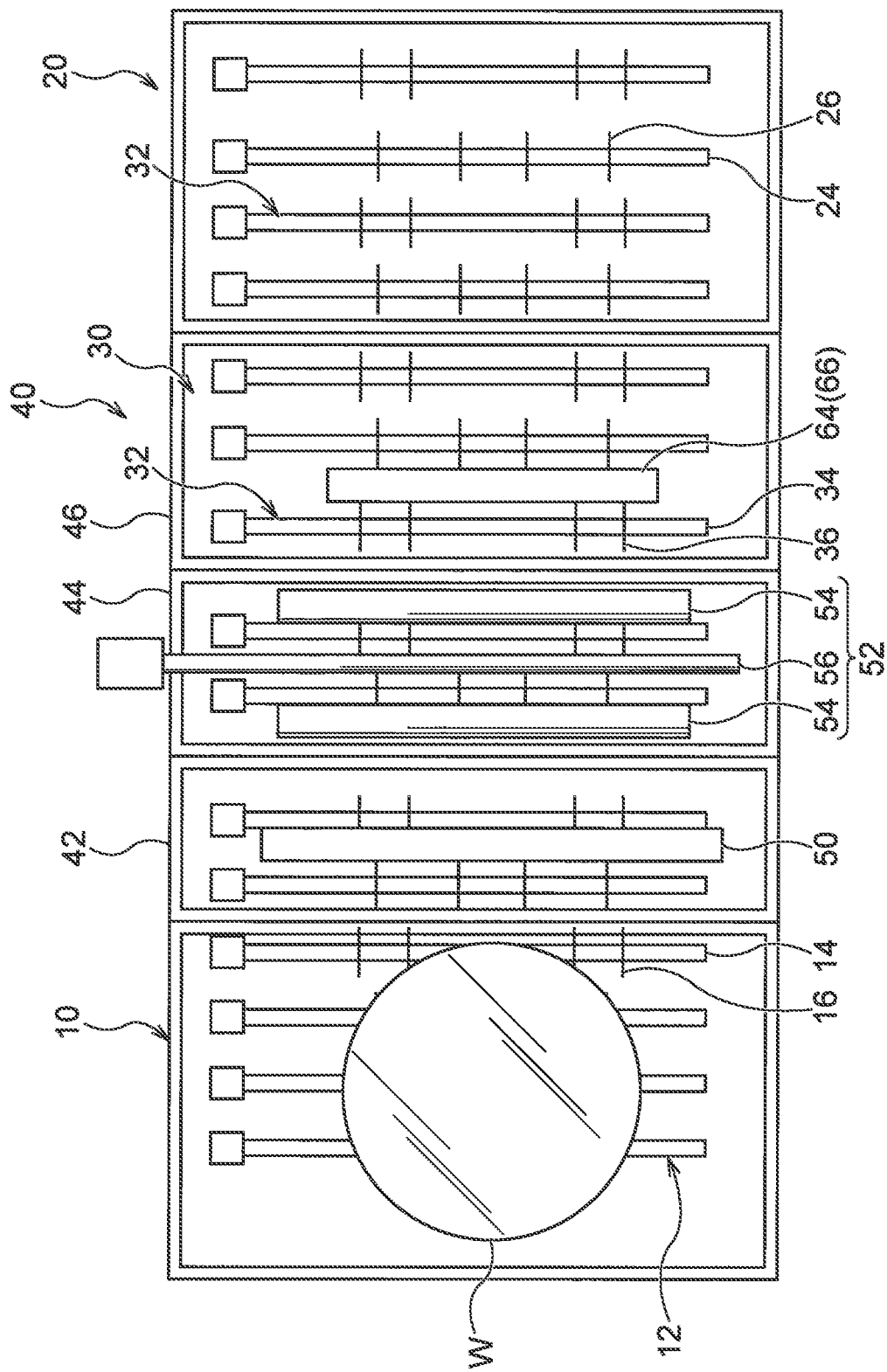
FIG. 1 is a plan view showing a substrate cleaning apparatus according to an embodiment of the present invention.

A substrate cleaning apparatus according to embodiments of the present invention will be described below with reference to FIGS. 1 to 6. Identical or corresponding parts are denoted by identical reference numerals in FIGS. 1 to 6, and will not be described in duplication.

Figure 2:
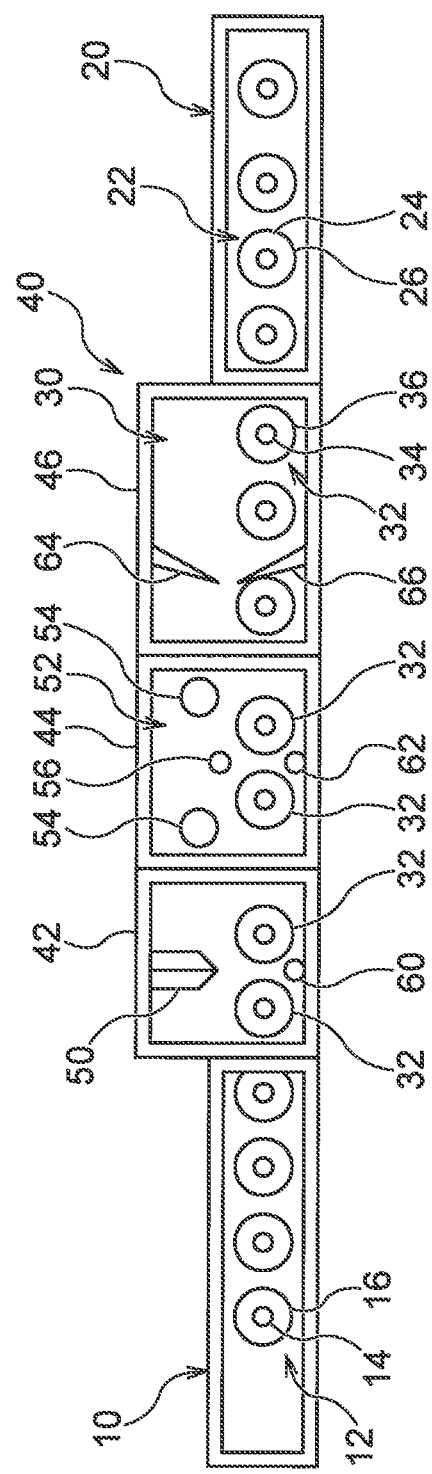
FIG. 2 is a sectional elevational view of the substrate cleaning apparatus shown in FIG. 1.

FIG. 1 is a plan view showing a substrate cleaning apparatus according to an embodiment of the present invention. FIG. 2 is a sectional elevational view of the substrate cleaning apparatus shown in FIG. 1. As shown in FIGS. 1 and 2, the substrate cleaning apparatus comprises an inlet roller conveyer 10 and an outlet roller conveyer 20, and a process chamber 40 disposed between the inlet roller conveyer 10 and the outlet roller conveyer 20 and having an inner roller conveyer 30 serving as a substrate conveying unit therein. These roller conveyers 10, 20 and 30 are configured to convey substrates horizontally in a sliding manner, with their front surfaces facing upwardly.

The inlet roller conveyer 10 has a plurality of rollers 12 disposed at predetermined intervals in parallel with each other along a conveyance direction of the substrate W, and the rollers 12 have respective shafts 14 which are rotated in the same direction in synchronization with each other. A plurality of wheels 16 are fixed to each shaft 14 at predetermined positions along an axial direction of the shaft 14. The outlet roller conveyer 20 has a plurality of rollers 22 disposed at predetermined intervals in parallel with each other along a conveyance direction of the substrate W, and the rollers 22 have respective shafts 24 which are rotated in the same direction in synchronization with each other. A plurality of wheels 26 are fixed to each shaft 24 at predetermined positions along an axial direction of the shaft 24. Similarly, the inner roller conveyer 30 serving as a substrate conveying unit has a plurality of rollers 32 disposed at predetermined intervals in parallel with each other along a conveyance direction of the substrate W, and the rollers 32 have respective shafts 34 which are rotated in the same direction in synchronization with each other. A plurality of wheels 36 are fixed to each shaft 34 at predetermined positions along an axial direction of the shaft 34.

In this embodiment, the inlet roller conveyer 10, the outlet roller conveyer 20 and the inner roller conveyer 30 are configured to construct a single roller conveyer. Specifically, the shafts 14 of the inlet roller conveyer 10, the shafts 24 of the outlet roller conveyer 20, and the shafts 34 of the inner roller conveyer 30 are configured to rotate in the same direction in synchronization with each other. Further, the height (conveyer height) of the upper ends of the wheels 16 of the inlet roller conveyer 10 from the floor surface, the height of the upper ends of the wheels 26 of the outlet roller conveyer 20 from the floor surface, and the height of the upper ends of the wheels 36 of the inner roller conveyer 30 from the floor surface are set to be the same. Thus, the substrate W placed horizontally on the inlet roller conveyer 10 with its front surface facing upwardly is conveyed smoothly from the inlet roller conveyer 10 to the inner roller conveyer 30 and from the inner roller conveyer 30 to the outlet roller conveyer 20.

In this embodiment, the process chamber 40 comprises a first cleaning chamber 42, a second cleaning chamber 44 and a drying chamber 46 arranged in series along the conveyance direction of the substrate W. Each of the chambers 42, 44 and 46 has slit-like openings (not shown), for allowing the substrate W placed horizontally on the roller conveyers 10, 20 and 30 to pass therethrough, at its inlet and outlet sides along the conveyance direction of the substrate W.

In this embodiment, a two-fluid nozzle 50 serving as a two-fluid jet cleaning unit is disposed above the substrate W which is placed on the inner roller conveyer 30 in the first cleaning chamber 42 and conveyed horizontally in a sliding manner by the inner roller conveyer 30. The two-fluid nozzle 50 is directed downwardly to eject a two-fluid jet comprising a fluid mixture of gas and liquid toward the surface (upper surface) of the substrate, thereby cleaning the surface of the substrate in non-contact state. The two-fluid nozzle (two-fluid jet cleaning unit) 50 is connected to a carrier gas supply line (not shown) for supplying a carrier gas such as $N_2$ gas and a cleaning liquid supply line (not shown) for supplying a cleaning liquid such as carbonated water produced by dissolving $CO_2$ gas into pure water or ultrapure water. The two-fluid nozzle 50 extends in a direction perpendicular to the conveyance direction of the substrate W over the entire length of a diametrical direction of the substrate W. The two-fluid nozzle 50 has a port extending linearly and continuously or ports provided intermittently at the lower end thereof.

With this arrangement, the carrier gas such as $N_2$ gas and the cleaning liquid such as carbonated water supplied to the interior of the two-fluid nozzle 50 are ejected from the port (or ports) of the two-fluid nozzle 50 at a high speed to produce a two-fluid jet stream in which the cleaning liquid (carbonated water) exists as minute liquid droplets (mist) in the carrier gas. Then, the two-fluid jet stream produced by the two-fluid nozzle 50 is directed toward the surface of the substrate W and impinges on the surface of the substrate W which is placed on the inner roller conveyer 30 and conveyed horizontally in a sliding manner by the inner roller conveyer 30. Therefore, particles and the like on the surface of the substrate W can be removed (cleaned) by utilizing impulse waves generated by impingement of the minute liquid droplets on the surface of the substrate W. In this manner, since the surface of the substrate W is cleaned by the two-fluid jet stream ejected from the two-fluid nozzle (two-fluid jet cleaning unit) 50, minute particles remaining on the surface of the substrate W which are difficult to remove by scrub cleaning can be removed. This holds true for the following ultrasonic cleaning unit 52.

The two-fluid nozzle (two-fluid jet cleaning unit) 50 produces a two-fluid jet stream and enables the produced two-fluid jet stream to impinge linearly on an area of the substrate W extending the entire length of the substrate W in a diametrical direction of the substrate W which is placed on the inner roller conveyer 30 and conveyed horizontally in a sliding manner by the inner roller conveyer 30 without rotating the substrate W. Therefore, the two-fluid jet stream can be supplied uniformly over the entire surface including the edge portion of the substrate W, and the entire surface of the substrate W can be cleaned uniformly and efficiently even if the substrate W has a hydrophobic surface and has a large diameter. Further, it is not necessary to provide a rotating mechanism for rotating the substrate W, and thus the volume of the first cleaning chamber 42 for housing the two-fluid nozzle 50 therein can be greatly diminished.

It is preferable as a cleaning liquid to use carbonated water produced by dissolving $CO_2$ gas into ultrapure water which has been deaerated to remove oxygen therefrom. By using such carbonated water, the resistivity of the cleaning liquid can be lowered to prevent electrostatic discharge damage of a surface of an object to be cleaned, for example, a surface of an insulating film.

In the present embodiment, an ultrasonic cleaning unit 52 for cleaning the surface (upper surface) of the substrate W in non-contact state by utilizing ultrasonic waves propagated in a liquid such as pure water is disposed above the substrate W which is placed on the inner roller conveyer 30 in the second cleaning chamber 44 and conveyed horizontally in a sliding manner by the inner roller conveyer 30. The ultrasonic cleaning unit 52 comprises a pair of liquid ejection nozzles 54 disposed downwardly and spaced from each other for ejecting a liquid such as pure water toward the surface of the substrate W placed on the inner roller conveyer 30 and conveyed horizontally in a sliding manner by the inner roller conveyer 30, and an ultrasonic transducer 56 disposed between the liquid ejection nozzles 54 for oscillating ultrasonic waves (megasonic energy) of about 0.5 to 5.0 MHz, for example. These liquid ejection nozzles 54 and the ultrasonic transducer 56 extend in a direction perpendicular to the conveyance direction of the substrate W over the entire length of the substrate in a diametrical direction of the substrate W. Each of the liquid ejection nozzles 54 has a port extending linearly and continuously or ports provided intermittently at the lower end thereof.

With this arrangement, while a liquid such as pure water is ejected from the ports of the pair of the liquid ejection nozzles 54 toward the surface of the substrate W placed on the inner roller conveyer 30 and conveyed horizontally in a sliding manner by the inner roller conveyer 30, ultrasonic waves oscillated from the ultrasonic transducer 56 are applied to the liquid accumulated on the surface of the substrate W to impart acting forces by vibrational acceleration of liquid molecules to particles and the like on the substrate of the substrate W. Thus, the particles and the like on the surface of the substrate W can be removed (cleaned).

In the ultrasonic cleaning unit 52 also, as with the above two-fluid nozzle (two-fluid jet cleaning unit) 50, while a liquid such as pure water is supplied to the area extending over the entire length of the substrate W in a diametrical direction of the substrate W placed on the inner roller conveyer 30 and conveyed horizontally in a sliding manner by the inner roller conveyer 30 without rotating the substrate W, the ultrasonic waves are applied to the liquid. Therefore, the liquid to which the ultrasonic waves are applied can be supplied uniformly over the entire surface including the edge portion of the substrate W, and the entire surface of the substrate W can be cleaned uniformly and efficiently even if the substrate W has a hydrophobic surface and has a large diameter. Further, it is not necessary to provide a rotating mechanism for rotating the substrate W, and thus the volume of the second cleaning chamber 44 for housing the ultrasonic cleaning unit 52 therein can be greatly diminished.

As shown in FIG. 2, pure water ejection nozzles 60 and 62 may be disposed upwardly to eject pure water toward the reverse surface (lower surface) of the substrate W at at least one of locations between the adjacent rollers 32 below the substrate W placed on the inner roller conveyer 30 in the first cleaning chamber 42 and the second cleaning chamber 44 and conveyed horizontally in a sliding manner by the inner roller conveyer 30. Therefore, the reverse surface of the substrate W may be cleaned (rinsed) by pure water ejected from at least one of the pure water ejection nozzles 60 and 62. The pure water ejection nozzles 60 and 62 extend in a direction perpendicular to the conveyance direction of the substrate W over the entire length of the substrate W in a diametrical direction of the substrate W, and each of the pure water ejection nozzles 60 and 62 has a port extending linearly and continuously or ports provided intermittently at the upper end thereof.

In the illustrated embodiment, by using the inner roller conveyer 30 serving as a substrate conveying unit and having the plural rollers 32 disposed at certain intervals in the process chamber 40, pure water can be ejected toward the reverse surface (lower surface) of the substrate W from the pure water ejection nozzles 60 and 62 disposed between the rollers 32 to rinse the reverse surface of the substrate W.

Inside the drying chamber 46, there are provided a pair of air knives 64 and 66 serving as an inert gas blowing unit configured to blow an inert gas such as $N_2$ gas or Ar gas toward the front and reverse surfaces of the substrate W. The air knives 64 and 66 are disposed above and below the substrate W placed on the inner roller conveyer 30 and conveyed horizontally in a sliding manner by the inner roller conveyer 30. Each of the air knives (inert gas blowing gas unit) 64 and 66 extends in a direction perpendicular to the conveyance direction of the substrate W over the entire length of the substrate W in a diametrical direction of the substrate W. Thus, the inert gas such as $N_2$ gas or Ar gas is blown linearly over the entire length of the substrate W in the diametrical direction of the substrate W from the blowing ports of the air knives 64 and 66 to dry the substrate W.

The air knives 64 and 66 are disposed so that the inert gas is blown toward the front and reverse surfaces of the substrate W and flows toward the inlet side of the process chamber 40 inside the process chamber 40. Specifically, the air knife 64 located above the substrate is disposed such that the air knife 64 extends obliquely downward to allow the blowing port at its lower end to be directed to the upstream side of the conveyance direction of the substrate as it extends downwardly. The air knife 66 located below the substrate is disposed such that the air knife 66 extends obliquely upward to allow the blowing port at its upper end to be directed to the upstream side of the conveyance direction of the substrate as it extends upwardly.

Then, the inert gas such as $N_2$ gas or Ar gas is blown from the air knives 64 and 66 toward the substrate W to form a flow of the inert gas such as $N_2$ gas or Ar gas toward the slit-like opening of the inlet side of the process chamber 40. By this flow of the inert gas, air can be prevented from flowing into the process chamber 40. Thus, the interior of the process chamber 40, i.e., the interiors of the first cleaning chamber 42, the second cleaning chamber 44 and the drying chamber 46 are kept in a certain inert gas atmosphere, for example, in an inert gas atmosphere having an oxygen concentration of 2% or less, preferably 1% or less.

As the inert gas blowing unit, the air knives 64 and 66 are used to blow the inert gas in the form of a sharp knife toward the front and reverse surfaces of the substrate W, and thus the substrate W can be dried more quickly and the flow of the inert gas formed in the process chamber 40 and flowing toward the inlet side of the process chamber 40 can be accelerated in its flow velocity.

An inclination angle of blowing the inert gas from the air knives 64 and 66 to the substrate is in the range of 0° to 30°, preferably 15° to 25° away from the vertical plane toward the inlet side of the process chamber 40. This inclination angle is determined from the two standpoints of the drying capability of the substrate by the inert gas and the formation of the flow of the inert gas capable of stopping inflow of the air through the inlet of the chamber.

As described above, in the first cleaning chamber 42 and the second cleaning chamber 44, the surface of the substrate W conveyed horizontally in a sliding manner can be cleaned without rotating the substrate W, and the reverse surface of the substrate W can be rinsed with pure water, as needed. Therefore, the volumes of the first cleaning chamber 42 and the second cleaning chamber 44 can be diminished as much as possible. Even in the drying chamber 46, since the substrate W can be dried without rotating the substrate, the volume of the drying chamber 46 can be diminished as much as possible.

In this manner, by making the volumes of the first cleaning chamber 42, the second cleaning chamber 44 and the drying chamber 46, which constitute the process chamber 40, small as much as possible, the inert gas blown from the air knives 64 and 66 onto the substrate W to dry the substrate W can be effectively utilized to produce a desired inert gas atmosphere in the process chamber 40 where corrosion of copper, used for interconnect metal, caused by contact of copper with pure water or the like can be prevented as much as possible. Particularly, by producing the inert gas atmosphere in the process chamber 40 having an oxygen concentration of 2% or less, preferably 1% or less, oxygen contained in the air in the process chamber 40 can be prevented from being taken into pure water or the like ejected toward the substrate W.

In the illustrated embodiment, the inlet roller conveyer 10, the outlet roller conveyer 20, and the inner roller conveyer 30 in the process chamber 40 are driven, and the substrate W to be cleaned is placed horizontally on the inlet roller conveyer 10. Then, the substrate W placed horizontally on the inlet roller conveyer 10 is conveyed in a sliding manner to the first cleaning chamber 42 of the process chamber 40, and the substrate W is cleaned by the two-fluid nozzle (two-fluid jet cleaning unit) 50 disposed in the first cleaning chamber 42. Thereafter, the substrate W is conveyed in a sliding manner from the first cleaning chamber 42 to the second cleaning chamber 44 of the process chamber 40, and the substrate W is ultrasonically cleaned by the ultrasonic cleaning unit 52 disposed in the second cleaning chamber 44. After the cleaning, the substrate W is conveyed in a sliding manner to the drying chamber 46, and the substrate W is dried by blowing the inert gas such as $N_2$ gas or Ar gas onto the substrate W from the air knives 64, 66 disposed in the drying chamber 46 and is then conveyed to the outlet roller conveyer 20. Thereafter, the dried substrate W is taken out from the outlet roller conveyer 20 and conveyed to a next process.

A series of cleaning and drying processes of the substrate W are performed in a slide conveyance process in which the substrate W is conveyed from the inlet roller conveyer 10 to the inner roller conveyer 30 of the process chamber 40 and then from the inner roller conveyer 30 of the process chamber 40 to the outlet roller conveyer 20 without rotating the substrate W. Therefore, even if the substrate W has a hydrophobic surface and has a large diameter, the entire surface of the substrate W can be processed uniformly and efficiently.

Further, by producing the inert gas atmosphere in the process chamber 40 having an oxygen concentration of 2% or less, preferably 1% or less, oxygen contained in the air in the process chamber 40 can be prevented from being taken into pure water or the like, containing no anticorrosive, ejected toward the substrate, and corrosion of copper, used for interconnect metal, caused by contact of copper with pure water or the like can be prevented.

Figure 3:
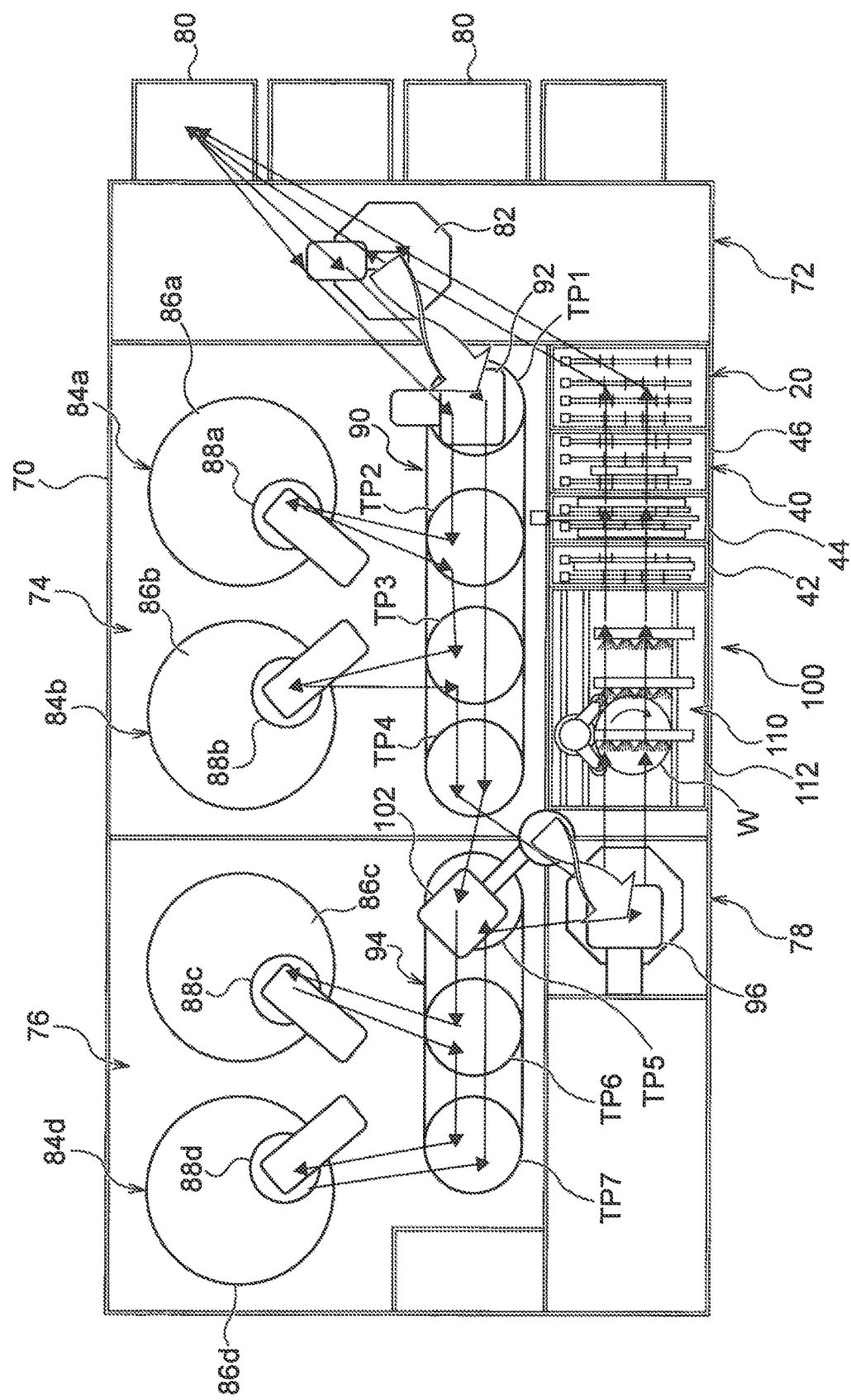
FIG. 3 is a schematic plan view showing an entire structure of a polishing apparatus having a substrate cleaning apparatus according to another embodiment of the present invention.

FIG. 3 is a schematic plan view showing an entire structure of a polishing apparatus having a substrate cleaning apparatus according to another embodiment of the present invention. As shown in FIG. 3, the polishing apparatus includes a substantially rectangular housing 70 whose interior is divided by partition walls into a loading/unloading section 72, a first polishing section 74, a second polishing section 76 and a cleaning section 78. The loading/unloading section 72, the polishing sections 74, 76, and the cleaning section 78 are independently fabricated and independently evacuated.

The loading/unloading section 72 includes at least two (e.g., four in this embodiment) front loading sections 80 on which substrate cassettes for storing a number of substrate such as a semiconductor wafers are placed. These front loading sections 80 are arranged side by side in a width direction (direction perpendicular to the longitudinal direction) of the polishing apparatus. Further, in the loading/unloading section 72, there is provided a transfer robot 82 on a moving mechanism (not shown) placed along the front loading sections 80 so that the transfer robot 82 is movable along the direction in which the substrate cassettes are arranged. The transfer robot 82 can access the substrate cassettes placed on the front loading sections 80 by moving on the moving mechanism.

The loading/unloading section 72 is an area that needs to be kept in the cleanest environment. Accordingly, the interior of the loading/unloading section 72 is constantly kept at a higher pressure than any of the outside of the apparatus, the polishing sections 74, 76 and the cleaning section 78. Further, a filter-fan unit (not shown) having an air filter, such as an HEPA filter or a ULPA filter, is provided above the transfer robot 82. Clean air, from which particles, toxic vapor and toxic gas have been removed, is blown off downwardly at all times by the filter-fan unit.

The first polishing section 74 is an area where the substrate is polished, and has a first polishing unit 84a and a second polishing unit 84b therein. The second polishing section 76 is also an area where the substrate is polished, and has a third polishing unit 84c and a fourth polishing unit 84d therein. These first polishing unit 84a, second polishing unit 84b, third polishing unit 84c and fourth polishing unit 84d are arranged along the longitudinal direction of the polishing apparatus.

The first polishing unit 84a includes a polishing table 86a having a polishing surface and a top ring 88a for holding the substrate and pressing the substrate against the polishing table 86a to polish the substrate. Similarly, the second polishing unit 84b includes a polishing table 86b and a top ring 88b, the third polishing unit 84c includes a polishing table 86c and a top ring 88c, and the fourth polishing unit 84d includes a polishing table 86d and a top ring 88d.

A first linear transporter 90 is provided between the first polishing unit 84a and the second polishing unit 84b in the first polishing section 74, and the cleaning section 78. This first linear transporter 90 is configured to transfer substrates between four transferring positions located along the longitudinal direction of the polishing apparatus (hereinafter, these four transferring positions will be referred to as a first transferring position TP1, a second transferring position TP2, a third transferring position TP3, and a fourth transferring position TP4 in the order from the loading/unloading section 72). A reversing machine 92 for reversing a substrate transferred from the transfer robot 82 in the loading/unloading section 72 is disposed above the first transferring position TP1 of the first linear transporter 90. A vertically movable lifter (not shown) is disposed below the reversing machine 92. A vertically movable pusher (not shown) is disposed below the second transferring position TP2, and a vertically movable pusher (not shown) is disposed below the third transferring position TP3.

In the second polishing section 76, a second linear transporter 94 is provided next to the first linear transporter 90. This second linear transporter 94 is configured to transfer substrates between three transferring positions located along the longitudinal direction of the polishing apparatus (hereinafter, these three transferring positions will be referred to as a fifth transferring position TP5, a sixth transferring position TP6, and a seventh transferring position TP7 in the order from the loading/unloading section 72). A pusher (not shown) is disposed below the sixth transferring position TP6 of the second linear transporter 94, and a pusher (not shown) is disposed below the seventh transferring position TP7 of the second linear transporter 94.

As can be understood from the fact that a slurry is used during polishing, the polishing sections 74, 76 are the dirtiest areas. Therefore, in order to prevent particles from spreading out of the polishing sections 74, 76, evacuation is conducted from surrounding spaces of the respective polishing tables in this embodiment. In addition, pressure in the interior of the polishing sections 74, 76 is set to be lower than any of pressure outside the apparatus, pressure in the cleaning section 78, and pressure in the loading/unloading section 72, so that scattering of particles is prevented. Typically, exhaust ducts (not shown) are provided below the polishing tables, respectively, and filters (not shown) are provided above the polishing tables, so that downward flows of clean air are formed through the filters and the exhaust ducts.

The cleaning section 78 is an area where polished substrates are cleaned. The cleaning section 78 includes a reversing machine 96 for reversing a substrate and a substrate cleaning apparatus 100 for cleaning the polished substrates according to another embodiment of the present invention. The reversing machine 96 and the substrate cleaning apparatus 100 are arranged in series along the longitudinal direction of the polishing apparatus. A filter fan unit (not shown), having a clean air filter, is provided above the substrate polishing apparatus 100. This filter fan unit is configured to remove particles from an air to produce clean air, and to form downward flow of the clean air at all times. Pressure in the interior of the cleaning section 78 is kept higher than pressure in the polishing sections 74, 76, so that particles in the polishing sections 74, 76 are prevented from flowing into the cleaning section 78.

A swing transporter 102 is provided between the first linear transporter 90 and the second linear transporter 94, and the reversing machine 96 of the cleaning section 78. The swing transporter 102 is configured to transfer a substrate from the fourth transferring position TP4 of the first linear transporter 90 to the fifth transferring position TP5 of the second linear transporter 94, from the fifth transferring position TP5 of the second linear transporter 94 to the reversing machine 96, and from the fourth transferring position TP4 of the first linear transporter 90 to the reversing machine 96, respectively.

Figure 4:
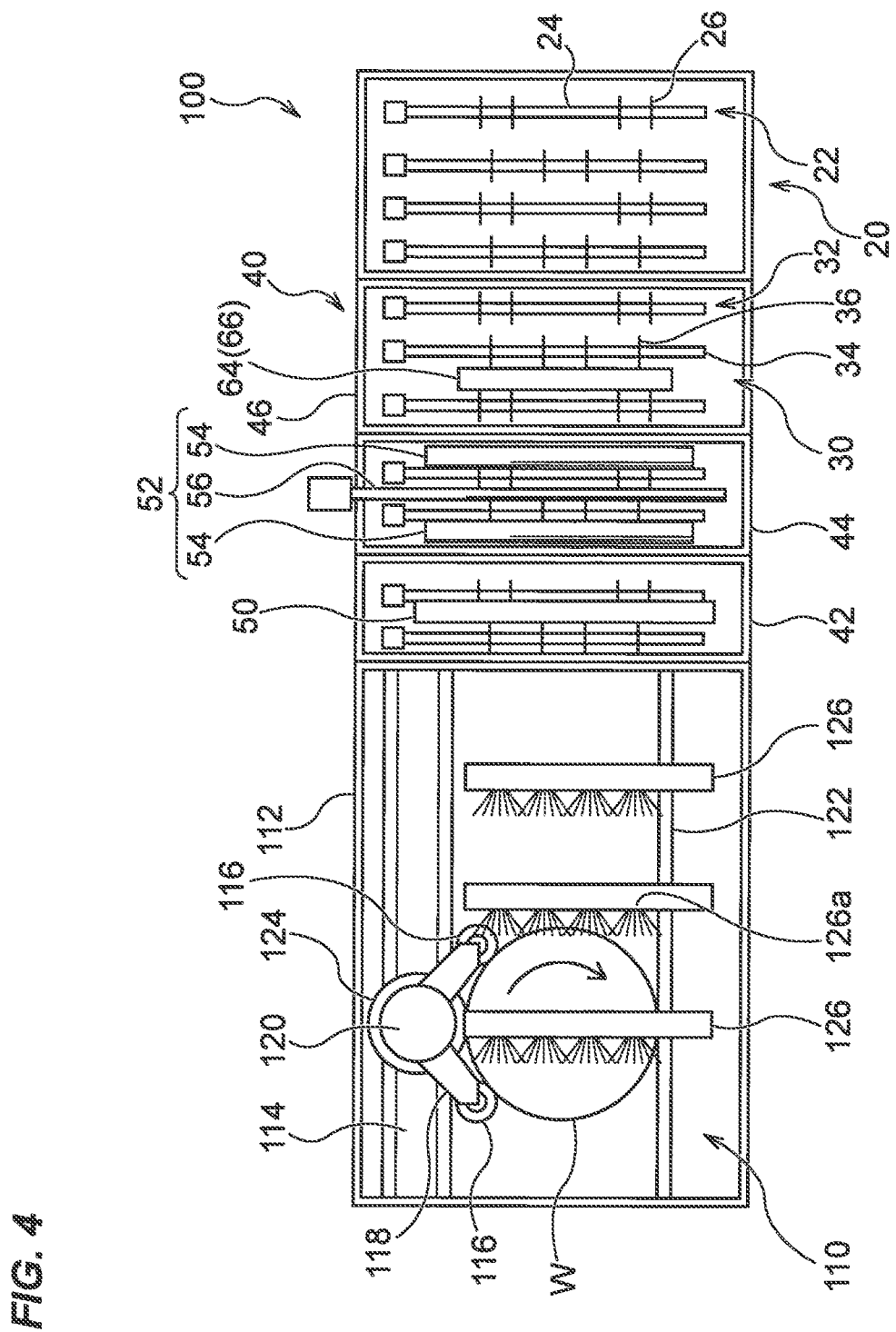
FIG. 4 is a plan view showing the substrate cleaning apparatus provided in the polishing apparatus shown in FIG. 3.
Figure 5:
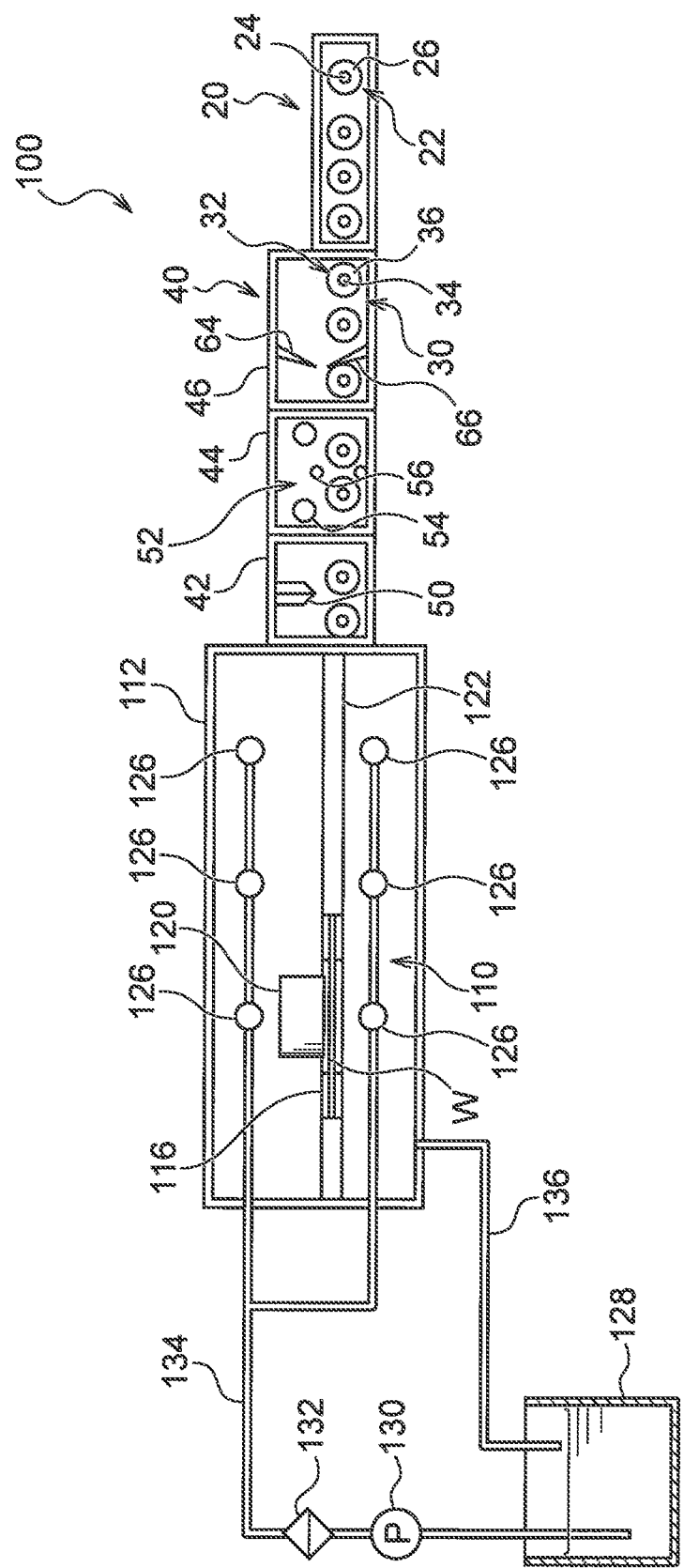
FIG. 5 is a sectional elevational view showing the substrate cleaning apparatus shown in FIG. 4 together with a cleaning liquid supply system.
Figure 6:
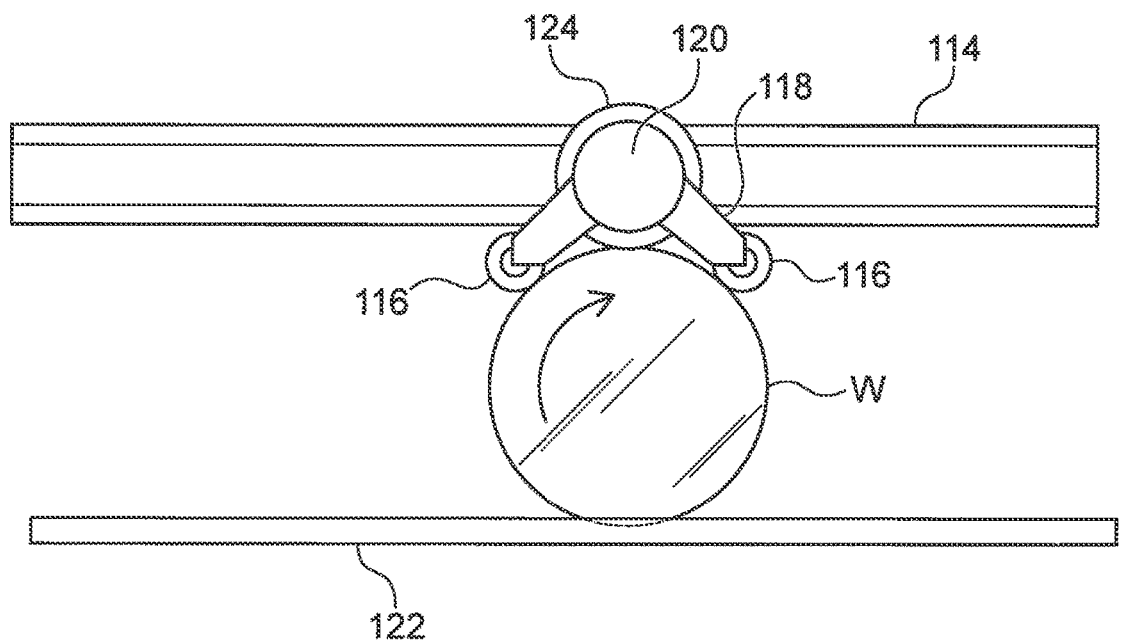
FIG. 6 is an enlarged plan view showing an essential part of a bevel cleaning unit of the substrate cleaning apparatus provided in the polishing apparatus shown in FIG. 3.

FIGS. 4 through 6 show the detailed structure of the substrate cleaning apparatus 100 according to another embodiment of the present invention shown in FIG. 3. As shown in FIGS. 4 through 6, the substrate cleaning apparatus 100 is different from the substrate cleaning apparatus shown in FIGS. 1 and 2 in that a bevel cleaning chamber 112 having a bevel cleaning unit 110 for cleaning a bevel portion therein is provided, in place of the inlet roller conveyer 10. Other structures of the substrate cleaning apparatus 100 is the same as the substrate cleaning apparatus shown in FIGS. 1 and 2. Specifically, in the substrate cleaning apparatus 100, the first cleaning chamber 42 of the process chamber 40 is coupled to the bevel cleaning chamber 112, and the substrate W is processed (bevel-cleaned) in the bevel cleaning chamber 112, and is then transferred to the inner roller conveyer 30 in the process chamber 40. While the substrate W is conveyed in a sliding manner from the inner roller conveyer 30 to the outlet roller conveyer 20, the substrate W is processed to clean the surface of the substrate and to dry the substrate.

The bevel cleaning unit 110 comprises a main guide rail 114 extending along the conveyance direction of the substrate W, a movable body 120 movable along the main guide rail 114 and having a pair of arms 118 whose forward ends have respective rotatable rollers 116, and an auxiliary guide rail 122 extending in parallel with the main guide rail 114. With this arrangement, the substrate W is supported horizontally by three points of the pair of the rollers 116 and the auxiliary guide rail 122, and is conveyed toward the process chamber 40 by movement of the movable body 120 while the substrate W is horizontally rotated by rotation of the rollers 116. A groove is formed in each of the outer circumferential surfaces of the rollers 116 and a groove is formed in a side surface of the auxiliary guide rail 122 facing the substrate W. When the substrate W is supported by the three points of the pair of the rollers 116 and the auxiliary guide rail 122, the edge portion of the substrate W is fitted into the grooves of the rollers 116 and the auxiliary guide rail 122 facing the substrate W to prevent the substrate W from dropping off.

When the substrate W is horizontally supported by the three points of the pair of the rollers 116 and the auxiliary guide rail 122, a cylindrical bevel cleaning member 124 such as brush or sponge is fixed at the location of the movable body 120 facing the bevel portion of the substrate W so as to bring the outer circumferential surface of the cylindrical bevel cleaning member 124 in sliding contact with the bevel portion of the substrate W.

Above and below the substrate W supported horizontally by the three points of the pair of the rollers 116 and the auxiliary guide rail 122 and conveyed horizontally in the bevel cleaning chamber 112, there are provided a plurality of cleaning liquid supply nozzles 126 disposed at predetermined positions along the longitudinal direction of the substrate cleaning apparatus 100 and having a plurality of ports 126*a* for ejecting the cleaning liquid toward the front and reverse surfaces of the substrate W. Each of the cleaning liquid supply nozzles 126 extend in a direction perpendicular to the conveyance direction of the substrate W over the entire length of the substrate W in a diametrical direction of the substrate W.

Further, a cleaning liquid tank 128 for storing the cleaning liquid therein is provided, and each of the cleaning liquid supply nozzles 126 is connected to a cleaning liquid supply line 134 extending from the cleaning liquid tank 128 and having a pump 130 and a filter 132 thereon. Further, the bottom portion of the bevel cleaning chamber 112 and the cleaning liquid tank 128 are connected to each other by a cleaning liquid return line 136. With this arrangement, the cleaning liquid stored in the cleaning liquid tank 128 can be circulated and reused.

In the illustrated embodiment, the bevel cleaning unit 110 is configured such that the cleaning liquid is ejected from the ports 126*a* of the respective cleaning supply nozzles 126, and the cleaning liquid collected in the bottom portion of the bevel cleaning chamber 112 is recovered by the cleaning liquid tank 128 and circulated. In this state, the polished substrate W is horizontally supported by the three points of the pair of the rollers 116 and the auxiliary guide rail 122 with its surface facing upwardly, and conveyed horizontally toward the process chamber 40 by movement of the movable body 120 while the substrate W is horizontally rotated by rotation of the rollers 116. Thus, the bevel portion of the substrate W is rubbed with the bevel cleaning member 124 in the presence of the cleaning liquid, thereby scrub-cleaning the bevel portion of the substrate W. The cleaning liquid includes anticorrosive, and hence corrosion of copper as interconnect metal caused by contact of the substrate W with the cleaning liquid can be prevented.

After cleaning of the bevel portion of the substrate W, the substrate W is transferred in its horizontal state to the inner roller conveyer 30 in the process chamber 40 of the substrate cleaning apparatus 100. As with the substrate cleaning apparatus shown in FIG. 1, while the substrate W is conveyed horizontally in a sliding manner on the inner roller conveyer 30, the substrate W is cleaned and dried, and is then transferred to the outlet roller conveyer 20. Thus, cleaning of the bevel portion of the substrate after polishing, cleaning of the surface of the substrate and drying of the substrate can be successively performed.

Next, a process example of the substrate conducted by the polishing apparatus having the above structure will be described below.

An odd-numbered (1, 3, . . . ) substrate is taken out of the substrate cassette of the front loading section 80 by the transfer robot 82, and the substrate is transferred to the reversing machine 92. The substrate is reversed so as to become its front surface facing downwardly by the reversing machine 92, and then transferred to the second transferring position TP2 of the first linear transporter 90. The substrate placed on the second transferring position TP2 is held by the top ring 86a of the first polishing unit 84a and polished on the polishing table 88a (first-step polishing), and is then returned to the second transferring position TP2 and transferred to the third transferring position TP3. The substrate placed on the third transferring position TP3 is held by the top ring 86b of the second polishing unit 84b and polished on the polishing table 88b (second-step polishing), and is then returned to the third transferring position TP3 and transferred to the fourth transferring position TP4.

The substrate placed on the fourth transferring position TP4 is held by the swing transporter 102 and conveyed to the reversing machine 96 of the cleaning section 78 by the swing transporter 102. The substrate is reversed to become its front surface facing upwardly. As described above, the reversed substrate is conveyed horizontally in the bevel cleaning chamber 112 of the substrate cleaning apparatus 100, and the bevel portion of the substrate is cleaned. After cleaning of the bevel portion, the substrate is horizontally conveyed in a sliding manner in the process chamber 40 of the substrate cleaning apparatus 100, and cleaning of the surface of the substrate and drying of the substrate are conducted. Then, the substrate is transferred to the outlet roller conveyer 20.

The cleaned and dried substrate on the outlet roller conveyer 20 is held by the transfer robot 82 and returned to the substrate cassette of the front loading section 80.

On the other hand, an even-numbered (2, 4, . . . ) substrate is taken out of the substrate cassette of the front loading section 80 by the transfer robot 82, and the substrate is transferred to the reversing machine 92. The substrate is reversed so as to become its front surface facing downwardly by the reversing machine 92, and then transferred to the fifth transferring position TP5 of the second linear transporter 94 through the first linear transporter 90 and the swing transporter 102, and further to the sixth transferring position TP6. The substrate placed on the sixth transferring position TP6 is held by the top ring 86c of the third polishing unit 84c and polished on the polishing table 88c (first-step polishing), and is then returned to the sixth transferring position TP6 and transferred to the seventh transferring position TP7. The substrate placed on the seventh transferring position TP7 is held by the top ring 86d of the fourth polishing unit 84d and polished on the polishing table 88d (second-step polishing), and is then returned to the seventh transferring position TP7 and transferred to the fifth transferring position TP5.

The substrate placed on the fifth transferring position TP5 is held by the swing transporter 102, and transferred to the reversing machine 96 of the cleaning section 78. The substrate is reversed to become its front surface facing upwardly by the reversing machine 96. As described above, the reversed substrate W is conveyed horizontally in the bevel cleaning chamber 112 of the substrate cleaning apparatus 100, and the bevel portion of the substrate W is cleaned. After cleaning of the bevel portion, the substrate W is horizontally conveyed in a sliding manner in the process chamber 40 of the substrate cleaning apparatus 100, and cleaning of the surface of the substrate and drying of the substrate are conducted. Then, the substrate is transferred to the outlet roller conveyer 20.

Then, the cleaned and dried substrate on the outlet roller conveyer 20 is held by the transfer robot 82 and returned to the substrate cassette of the front loading section 80.

According to the polishing apparatus of the illustrated embodiment, while the substrate is held horizontally, cleaning of the bevel portion of the substrate after polishing, cleaning of the surface of the substrate and drying of the substrate can be successively performed.

Although certain preferred embodiments of the present invention have been shown and described in detail, it should be understood that various changes and modifications may be made without departing from the scope of the appended claims.

What is claimed is:
1. A substrate cleaning apparatus comprising:
 a process chamber having a substrate conveying unit therein configured to hold a substrate horizontally with its upper surface facing upwardly and to convey the substrate in one direction;
 a cleaning unit provided in the process chamber and configured to clean a surface of the substrate;
 a drying unit provided in the process chamber and configured to dry the substrate, the cleaning unit and the drying unit being arranged in series along a conveyance direction of the substrate; and
 an inert gas blowing unit provided in the drying unit and configured to blow an inert gas toward front and reverse surfaces of the substrate to dry the substrate, wherein an inert gas source supplies inert gas to the inert gas blowing unit, and a blowing port of the inert gas blowing unit being directed to an upstream side of the conveyance direction of the substrate to form a flow of the inert gas toward the cleaning unit,
 wherein an inert gas atmosphere, produced by blowing the inert gas from the inert gas blowing unit, disperses throughout the process chamber including the cleaning unit and the drying unit.
2. The substrate cleaning apparatus according to claim 1, wherein the flow of the inert gas toward an inlet side of the process chamber is formed by blowing the inert gas toward the front and reverse surfaces of the substrate from the inert gas blowing unit.

3. The substrate cleaning apparatus according to claim 1, wherein the inert gas comprises $N_2$ gas or Ar gas, and an inert gas atmosphere in the process chamber comprises an atmosphere having an oxygen concentration of 2% or less.

4. The substrate cleaning apparatus according to claim 1, wherein the cleaning unit comprises at least one of a two-fluid jet cleaning unit configured to clean the surface of the substrate with two-fluid jet stream comprising a fluid mixture of gas and liquid and an ultrasonic cleaning unit configured to clean the surface of the substrate with ultrasonic waves propagated in liquid.

5. The substrate cleaning apparatus according to claim 1, wherein the substrate conveying unit comprises a roller conveyer having a plurality of rollers spaced from each other, and a cleaning liquid supply nozzle configured to supply a cleaning liquid to the reverse surface of the substrate disposed at an upstream side of the inert gas blowing unit.

6. The substrate cleaning apparatus according to claim 1, wherein the inert gas blowing unit comprises at least one air knife configured to blow the inert gas in the form of a sheet to the substrate.

7. The substrate cleaning apparatus according to claim 1, further comprising a bevel cleaning chamber coupled to an inlet of the process chamber and having a bevel cleaning unit configured to clean a bevel portion of the substrate therein.

8. The substrate cleaning apparatus according to claim 7, wherein the bevel cleaning unit is configured to clean the bevel portion of the substrate while holding the substrate horizontally and rotating the substrate by rotation of rollers provided in the bevel cleaning unit, and to transfer the substrate to the substrate conveying unit while holding the substrate horizontally.

\* \* \* \* \*